US005283527A

United States Patent [19]

DeBiasi

[11] Patent Number: 5,283,527

[45] Date of Patent: Feb. 1, 1994

[54] METHODS AND APPARATUS FOR DETECTING SHORT CIRCUITED SECONDARY COIL WINDING VIA MONITORING PRIMARY COIL WINDING

[75] Inventor: Charles J. DeBiasi, Allen Park, Mich.

[73] Assignee: Ford Motor Company, Dearborn, Mich.

[21] Appl. No.: 723,475

[22] Filed: Jun. 28, 1991

[51] Int. Cl.[5] .......... F02P 17/00; G01R 31/06

[52] U.S. Cl. .......... 324/391; 324/388; 324/546; 324/379; 123/643

[58] Field of Search .......... 324/379, 380, 382, 384, 324/391, 392, 546, 388; 123/427, 609, 644, 643, 481

[56] References Cited

U.S. PATENT DOCUMENTS

| | | | |
|---|---|---|---|
| 3,961,240 | 6/1976 | Pohl | 324/399 |
| 4,053,823 | 10/1977 | Adamian | 324/17 |
| 4,379,263 | 4/1983 | Everett et al. | 324/379 |
| 4,408,583 | 10/1983 | Merrick | 123/415 |
| 4,459,544 | 7/1984 | Makita | 324/391 |
| 4,508,092 | 4/1985 | Kiess et al. | 123/617 |
| 4,684,896 | 8/1987 | Weishaupt | 324/399 |
| 4,750,467 | 6/1988 | Neuhalfen | 123/644 |
| 4,760,341 | 7/1988 | Skerritt | 324/379 |
| 4,773,380 | 9/1988 | Narita et al. | 123/609 |
| 4,886,029 | 12/1989 | Lill et al. | 324/380 X |
| 4,913,123 | 4/1990 | DeBiasi et al. | 123/609 |
| 4,915,086 | 4/1990 | Ciliberto et al. | 123/609 |
| 4,918,389 | 4/1990 | Schleupen et al. | 324/399 |
| 4,969,443 | 11/1990 | DeBiasi | 123/481 |

FOREIGN PATENT DOCUMENTS 2752244 6/1979 Fed. Rep. of Germany .

*Primary Examiner*—Gerard R. Strecker
*Assistant Examiner*—Diep Do
*Attorney, Agent, or Firm*—Peter Abolins; Roger L. May

[57] ABSTRACT

Methods and apparatus for detecting low impedance short circuits in a secondary winding circuit of a coil of a distributorless ignition system (DIS) by analyzing spark discharge signals on a primary winding of the ignition coil. In one embodiment, the duration times of the spark discharge signals are compared to a threshold spark duration time, with a low impedance short circuit being indicated if the threshold spark duration time is exceeded. In another embodiment, two or more spark dwell signals are applied to the primary of the ignition coil for each spark event of each associated pair of engine cylinders. A first or base time period is determined for the first dwell signal by measuring the time it takes the first dwell signal to produce a preselected current flow in the primary winding. A second time period is then determined by measuring the time it takes the second dwell signal to produce the same preselected current flow in the primary winding. The second time period is then compared to the first time period to determine whether a short circuit exists in the secondary winding circuit. A guard-band time period is subtracted from the first time period to define a minimum duration time for the second time period. If the second time period is equal to or exceeds the minimum duration time, a normal secondary winding circuit is indicated. If the second time period is less than the minimum duration time, a short circuited secondary winding circuit is indicated.

16 Claims, 2 Drawing Sheets

METHODS AND APPARATUS FOR DETECTING SHORT CIRCUITED SECONDARY COIL WINDING VIA MONITORING PRIMARY COIL WINDING

CROSS REFERENCE TO RELATED APPLICATION

The present application is related to application Ser. No. 07/734,377 which is entitled Cylinder Identification By Spark Discharge Analysis For Internal Combustion Engines which was filed by the inventor of the present application on Jul. 22, 1991, is assigned to the same assignee and has now issued as U.S. Pat. No. 5,174,267.

BACKGROUND OF THE INVENTION

The present invention relates generally to internal combustion engine ignition systems and, more particularly, to a method and apparatus for detecting a low impedance short circuit in an ignition coil secondary winding circuit of an internal combustion engine having a distributorless ignition system (DIS). Distributorless ignition system (DIS) will be used herein to designate an ignition system wherein spark is simultaneously provided to both cylinders of each of one or more pairs of cylinders making up an engine. For such ignition systems, while spark is provided at the correct time for ignition of a fuel charge in one of the cylinders of a pair, spark is also provided in the other one of the cylinders of the pair, which other cylinder is at the end of its exhaust stroke and beginning of its induction stroke.

Stricter vehicle emission standards now required in the United States, Europe and other industrialized countries have created substantial interest in the detection and diagnostics of engine misfiring which is frequently caused by faults in the secondary winding circuit of an ignition coil. Once a misfire has been detected, the fuel control system can be controlled to eliminate or reduce fuel to a malfunctioning cylinder. If fuel continues to be provided to a malfunctioning cylinder, it will result in increased unburned fuel or hydrocarbon (HC) emissions and can lead to damage of a catalytic converter associated with the engine.

Misfiring in conventional ignition systems of internal combustion engines is detected in U.S. Pat. No. 4,918,389 based on a shorter duration of secondary and consequently primary voltage during a misfire. Detected misfires are typically caused by an open circuit in the ignition system due to worn spark plugs, disconnected secondary wiring and the like. A signal indicating the voltage induced in the primary winding of an ignition coil is detected, a reference voltage representing normal firing is generated and the two are compared. The reference voltage is a pulse of predetermined magnitude and duration and the detected voltage on the primary is compared to the pulse to detect if the magnitude of the detected voltage falls below the predetermined magnitude before the end of the pulse. Unfortunately, the disclosed arrangement does not function properly for a DIS.

Open circuit conditions in the secondary winding of a DIS are detected and protected against as described in U.S. Pat. No. 4,969,443. However, the disclosed system does not provide for the detection of a low impedance short circuit in the secondary winding circuit of an engine coil. Such low impedance short circuits are one of the most probable failure modes of an ignition system, for example due to spark plug carbon/ash fouling, and one of the most difficult to accurately detect.

Accordingly, there is a need for reliable and accurate detection of low impedance short circuits in the secondary winding circuits of DIS's to enable an engine controller to adapt fueling in compliance with Federal clean air requirements during such ignition system malfunctions.

SUMMARY OF THE INVENTION

This need is met by the method and apparatus of the present invention wherein spark discharge signals on a primary winding of an ignition coil are analyzed to detect low impedance short circuits in a secondary winding circuit of the coil of a distributorless ignition system (DIS). Applicant has determined that the duration of spark discharge signals is extended if a low impedance short circuit is present in the secondary winding circuit, for example by a spark plug which has been fouled by carbon or ash deposits. Accordingly, in one embodiment of the invention, the duration times of the spark discharge signals are compared to a threshold spark duration time, with a low impedance short circuit being indicated if the threshold spark duration time is exceeded. Due to the high signal amplitude and poor quality of coil primary voltage signals, a second embodiment of the invention is presently preferred.

In the second embodiment, two or more spark dwell signals are applied to the primary of the ignition coil for each spark event of each associated pair of engine cylinders. A first or base time period is determined for the first dwell signal by measuring the time it takes the first dwell signal to produce a preselected current flow in the primary winding. A second time period is then determined by measuring the time it takes the second dwell signal to produce the same preselected current flow in the primary winding. The second time period is then compared to the first time period to determine whether a short circuit exists in the secondary winding circuit. Preferably, a guard-band time period is subtracted from the first time period to define a minimum duration time for the second time period. If the second time period is equal to or exceeds the minimum duration time, a normal secondary winding circuit is indicated. If the second time period is less than the minimum duration time, a short circuited secondary winding circuit is indicated.

Operation of the second embodiment is based on the fact that if a short circuit is present in the secondary winding circuit, the energy is withdrawn from the coil more slowly such that energy remains in the primary winding when the second dwell signal is applied thereto. Thus, the time required for the second dwell signal to raise the current level in the primary winding to the preselected level is less than the time required by the first or any other dwell signal which must build current flow in the primary winding substantially from zero.

In accordance with one aspect of the present invention, a method of detecting a low impedance short circuit in a secondary winding circuit of an ignition coil of an internal combustion engine having a distributorless ignition system, the ignition coil including a secondary winding and an associated primary winding, comprises the steps of: driving the primary winding to generate spark discharge energy in the secondary winding circuit which is connected to spark producing devices in first and second cylinders of the internal combustion engine to form the secondary winding circuit, the first and second cylinders making up a cylinder pair of the internal combustion engine; monitoring the primary winding for signals representative of spark discharge in the secondary winding circuit; and, analyzing spark discharge signals on the primary winding to detect a low impedance short circuit in the secondary winding circuit.

In one embodiment, the step of analyzing the spark discharge signals to detect a low impedance short circuit in the secondary winding circuit comprises the steps of: comparing the duration times of the spark discharge signals to a threshold spark duration time; and, indicating a low impedance short circuit if the duration times of the spark discharge signals exceed the threshold spark duration time.

In another embodiment of the invention, the step of driving the primary winding to generate spark discharge energy in the secondary winding circuit comprises the step of providing at least first and second drive signals to the primary winding for each spark event. In this embodiment, the step of analyzing the spark discharge signals to detect a low impedance short circuit in the secondary winding circuit may comprise the steps of: determining a time period required for the first drive signal to produce current flow in the primary winding equal to a preselected magnitude; stopping the second drive signal to the primary winding when current flowing in the primary winding reaches the preselected magnitude; determining the time duration of the second drive signal; and, comparing the first time period of the first drive signal to the time duration of the second drive signal.

Alternately, the step of analyzing the spark discharge signals to detect a low impedance short circuit in the secondary winding circuit may comprise the steps of: determining a first time period required for the first drive signal to produce current flow in the primary winding equal to a preselected magnitude; determining a second time period required for the second drive signal to produce current flow in the primary winding equal to the preselected magnitude; and, comparing the first and second time periods. Preferably in either event, the step of comparing the first and second time periods comprises: determining a minimum duration time threshold for the second time period by subtracting a time guard-band from the first time period; and, comparing the second time period to the minimum duration time threshold.

The method may further comprise the steps of: indicating a normal secondary winding circuit if the second time period is greater than or equal to (≧) the minimum duration time threshold; and, indicating a low impedance short circuited secondary winding circuit if the time duration of the second time period is less than (<) the minimum duration time threshold.

In accordance with another aspect of the present invention, a method of detecting a low impedance short circuit in a secondary winding circuit of an ignition coil of an internal combustion engine having a distributorless ignition system, the ignition coil including a secondary winding and an associated primary winding, comprises the steps of: driving the primary winding with at least first and second dwell signals for each spark event to produce at least first and second spark discharges at spark producing devices mounted, respectively, in first and second cylinders making up a cylinder pair of the internal combustion engine, the first and second spark producing devices being connected to the secondary winding to form the secondary winding circuit; determining a first time period required for the first drive signal to produce current flow in the primary winding equal to a preselected magnitude; determining a second time period required for the second drive signal to produce current flow in the primary winding equal to the preselected magnitude; and, comparing the durations of the first and second time periods to detect a low impedance short circuit in the secondary winding circuit.

The step of determining a second time period required for the second drive signal to produce current flow in the primary winding equal to the preselected magnitude may comprise the steps of: stopping the second drive signal to the primary winding when current flowing in the primary winding reaches the preselected magnitude; and, determining the time duration of the second drive signal. The step of comparing the durations of the first and second time periods may comprise: determining a minimum time duration for the second time period by subtracting a time guard-band from the time duration of the first time period; and, comparing the second time period to the minimum time duration Here again, the method may further comprise the steps of: indicating a normal secondary winding circuit if the second time period is greater than or equal to (≧) the minimum time duration; and, indicating a low impedance short circuited secondary winding circuit if the second time period is less than (<) the minimum time duration.

In accordance with yet another aspect of the present invention, a distributorless ignition system for an internal combustion engine comprises an ignition coil having a primary winding and a secondary winding. First circuit means are connected to the coil for driving the primary winding with dwell signals to produce spark discharges at first and second spark producing devices mounted, respectively, in first and second cylinders making up a cylinder pair of the internal combustion engine with the first and second spark producing devices being connected to the secondary winding to form a secondary winding circuit. Sensor means is coupled to the primary winding of the ignition coil for generating primary signals representative of operation of the ignition coil in response to the dwell signals. Detector means is coupled to the sensor means and is responsive to the primary signals for detecting a low impedance short circuit in the secondary winding circuit.

The primary signals are representative of voltage across the primary winding and, in one embodiment of the present invention, the detector means provides for determining when the voltage is above a preselected threshold and for generating spark event signals representative thereof. The first circuit means further provides for comparing the spark event signals to a threshold spark duration time and indicating a low impedance short circuit in the secondary winding circuit when the threshold spark duration time is exceeded by the spark event signals.

In a second embodiment, the first circuit means drives the primary winding with at least first and second dwell signals for each spark event. In this embodiment, the primary signals are representative of current flow in the primary winding and the detector means provides for detecting when current in the primary winding reaches a predetermined level and for generating current mark signals representative thereof. The first circuit means is responsive to current mark signals generated in response to the first dwell signals and current mark signals generated in response to the second dwell signals for detecting a low impedance short circuit in the secondary winding circuit.

For this detection, the first circuit means compares the time periods of current mark signals generated in response to the second dwell signals to a threshold defined by the time periods of current mark signals generated in response to the first dwell signals less a guard-band time.

In accordance with still another aspect of the present invention, a distributorless ignition system for an internal combustion engine comprises an ignition coil having a primary winding and a secondary winding. First circuit means is provided for driving the primary winding with at least first and second dwell signals to produce at least first and second spark discharges for each spark event at first and second spark producing devices. The first and second spark producing devices are mounted, respectively, in first and second cylinders making up a cylinder pair of the internal combustion engine and are connected to the secondary winding to form a secondary winding circuit. Sense means is provided for generating a primary current signal representative of the current flowing in the primary winding. Detector means is coupled to the sense means for detecting when current in the primary winding reaches a preselected threshold and for generating current mark signals indicative thereof. The first circuit means is responsive to current mark signals generated in response to the first dwell signals and current mark signals generated in response to the second dwell signals for detecting a low impedance short circuit in the secondary winding circuit.

It is thus a feature of the present invention to provide a method and apparatus for the reliable and accurate detection of low impedance short circuits in the secondary winding circuits of DIS's; to provide a method and apparatus for the reliable and accurate detection of low impedance short circuits in the secondary winding circuits of DIS's wherein primary signals are monitored to perform the detection; to provide a method and apparatus for the reliable and accurate detection of low impedance short circuits in the secondary winding circuits of DIS's wherein primary signals representative of primary voltage are monitored to perform the detection; and, to provide a method and apparatus for the reliable and accurate detection of low impedance short circuits in the secondary winding circuits of DIS's wherein two or more dwell signals are applied to the primary of a coil with the time for current build up in the primary winding to a preselected value being monitored for two dwell signals and compared to perform the detection.

Other features and advantages of the invention will be apparent from the following description, the accompanying drawings and the appended claims.

DETAILED DESCRIPTION OF THE INVENTION

Figure 1:
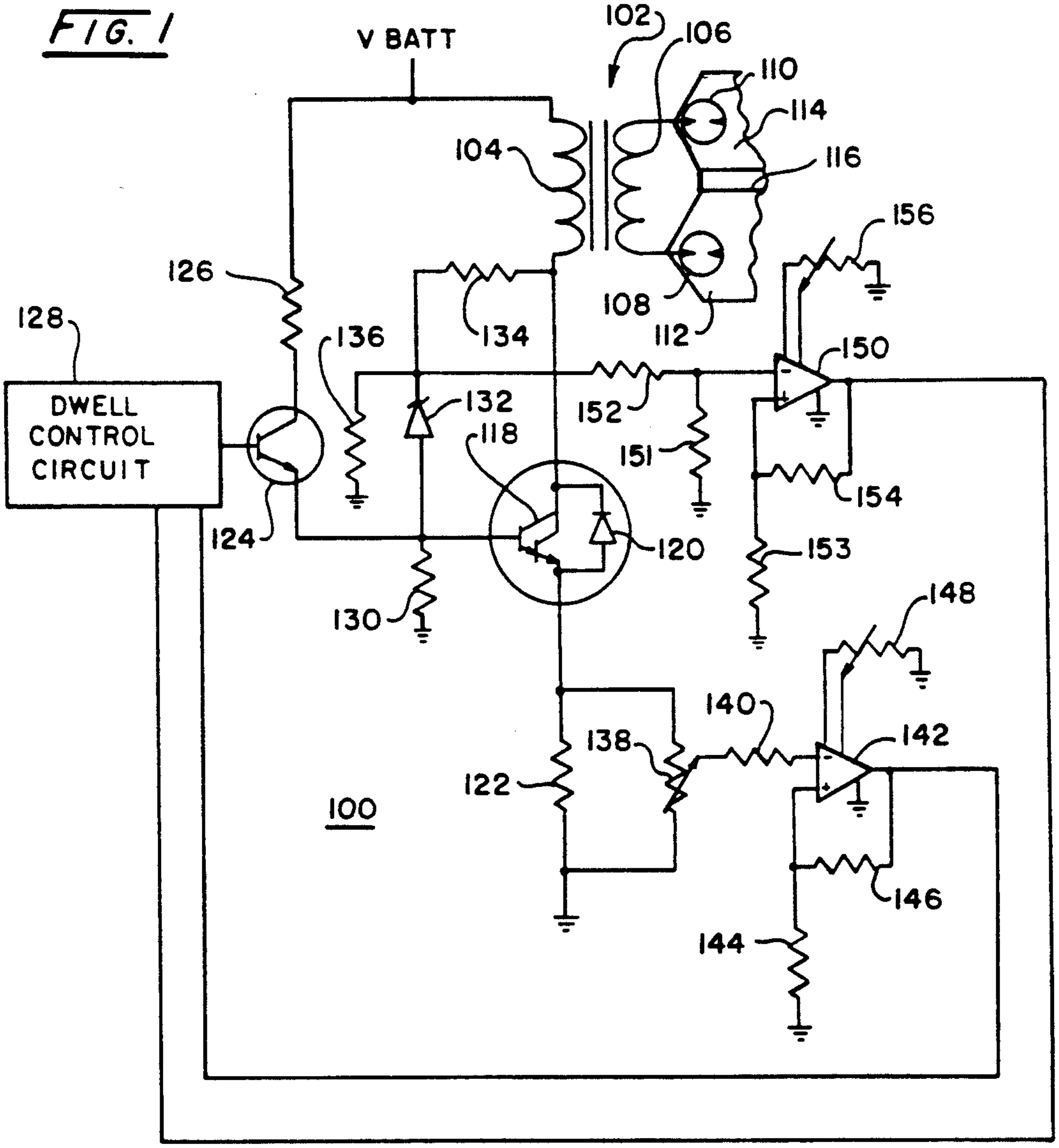
FIG. 1 is a schematic drawing of a distributorless ignition system operable in accordance with the present invention.

Reference is now made to drawing FIG. 1 which illustrates in schematic form a distributorless ignition system (DIS) 100 for operating a pair of cylinders of an internal combustion engine including the pair of cylinders. The DIS 100 illustrated will operate a two cylinder engine; however, it is noted that additional pairs of cylinders can be provided in accordance with the present invention for four, six, eight or more cylinder engines. The DIS 100 includes an ignition coil 102 having a primary winding 104 and a secondary winding 106. The secondary winding 106 is connected to spark producing devices, such as spark plugs 108, 110, in first and second cylinders 112, 114, respectively, of an internal combustion engine 116 to form a secondary winding circuit, the first and second cylinders 112, 114 making up a cylinder pair of the internal combustion engine 116.

The primary winding 104 is connected in series with a battery, VBATT, the parallel combination of a Darlington driver 118 and an internal protection diode 120, and a current sense resistor 122. A base input of the Darlington driver 118 is connected to the battery, VBATT, through the series combination of a collector/emitter circuit of a transistor 124 and a collector resistor 126. A dwell signal is supplied to a base input of the transistor 124 to drive the primary 104 and thereby generate spark discharge energy in the secondary circuit including the spark plugs 108, 110.

The dwell signal is generated by a dwell control circuit 128 which comprises or includes a processor, typically a microprocessor, to control the dwell signals provided to the transistor 124 and also control the operation of the present invention. The base of the Darlington driver 118 is coupled to ground through a resistor 130 and to its collector through the series combination of a Zener diode 132 and a resistor 134. The node between the diode 132 and the resistor 134 is coupled to ground through a resistor 136. An adjustable trim resistor 138 is coupled in parallel with the current sense resistor 122 with an adjustable pickup terminal connected from the trim resistor 138 through an input resistor 140 to the negative input of a current sensing comparator 142.

The positive input of the comparator 142 is coupled to ground through a resistor 144 with the output of the comparator 142 being coupled back to the positive input of the comparator 142 through a feedback resistor 146. An offset adjustment resistor 148 connects the comparator 142 to ground with the output of the comparator 142 generating signals representative of a low impedance short circuit in the secondary winding circuit in one embodiment of the present invention.

The negative input of a voltage sensing comparator 150 is connected to ground through a resistor 151 and to the primary 104 of the coil 102 through a series connection of a resistor 152 and the resistor 134. The positive input of the comparator 150 is coupled to ground through a resistor 153 with the output of the comparator 150 being coupled back to the positive input of the comparator 150 through a feedback resistor 154. An offset adjustment resistor 156 connects the comparator 150 to ground with the output of the comparator 150 indicating a low impedance short circuit in the secondary winding circuit in an alternate embodiment of the present invention. The outputs of the comparators 142, 150 are connected back to the dwell control circuit 128 for operation of the present invention. While both the comparator 142 and the comparator 150 may be provided in a single package for the sake of providing a single part for both embodiments of the present invention referred to above, it will be apparent that either one or the other can be provided alone dependent upon the embodiment and sensing operation selected for a given application.

As previously noted, operation of a Distributorless Ignition System (DIS) requires the coil 102 to fire two simultaneous spark events via the secondary circuit comprising the secondary winding 106 and the spark plugs 108, 110. One spark effects combustion in the properly charged cylinder 112 or 114 and the other spark is wasted in the other cylinder 114 or 112 which is under exhaust, see FIG. 1. As with any spark event, the spark in the DIS 100 progresses in three phases, breakdown, arc, and glow. The breakdown phase occurs when the voltage on the coil secondary winding 106 exceeds the breakdown voltage of the spark gaps of the two series connected spark plugs 108, 110. The breakdown phase is followed by the arc phase which initiates flame development and combustion in the properly charged cylinder. The final phase, glow, is of the longest duration and discharges the bulk of the coil energy. Glow discharge terminates when insufficient coil energy remains to sustain current flow across the gaps of the spark plugs 108, 110.

During a typical low impedance short circuit in the secondary winding circuit, caused for example by carbon or ash deposits in the spark gaps of the spark plugs 108, 110, only one spark gap exists in the secondary winding circuit. Due to the lower voltage requirements of a single spark gap, the energy dissipation is extended over a longer time period, see FIG. 2 which illustrates the difference in primary voltage waveforms with secondary loading of two spark gaps by the dotted line waveform 160 and with one spark gap and a fouled or shorted plug by the solid line waveform 162. The difference in the rate of discharge is indicative of coil secondary circuit conditions.

While cylinder conditions also effect coil discharge rates, i.e. longer discharge rates are caused by decreased compression and low swirl, a shorted spark plug under compression in a DIS is the predominate factor affecting spark discharge times. Therefore, detection of a low impedance short circuit in the secondary winding circuit is possible by measuring remaining coil energy after a period of time in which the coil would have been fully discharged with two clean spark gaps. A low impedance short circuit in the secondary winding circuit is detected in the present invention by monitoring the primary winding 104 for signals representative of spark discharge in the secondary winding circuit. The resulting spark discharge signals appearing on the primary winding 104 are analyzed to detect the low impedance short circuit in the secondary winding circuit.

Figure 2:
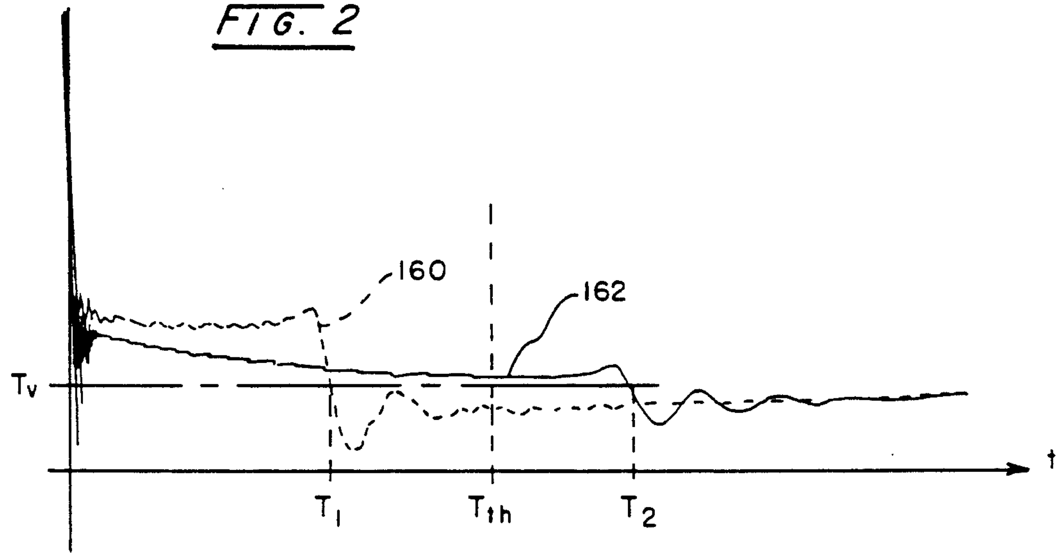
FIG. 2 is a graphic representation of primary coil voltages showing differences in the voltage waveform present when a secondary circuit of an ignition coil of FIG. 1 is properly operating and when the secondary circuit includes a low impedance short circuit.

In one embodiment of the present invention, the analysis is performed by comparing the duration times of the spark discharge signals represented by the waveforms 160, 162 in FIG. 2 to a threshold spark duration time, $T_{th}$. A low impedance short circuit in the secondary winding circuit is indicated if the duration times of the spark discharge signals exceed the threshold spark duration time $T_{th}$. See FIG. 2 wherein the spark discharge signal represented by the waveform 162 exceeds the threshold spark duration time $T_{th}$ and the spark discharge signal represented by the waveform 160 does not exceed the threshold spark duration time $T_{th}$. As shown in FIG. 2, the spark discharge signal represented by the waveform 160 has effectively terminated by the time $T_1$ while the spark discharge signal represented by the waveform 162 does not terminate until the time $T_2$.

Since this embodiment of the present invention analyses the voltage on the coil primary winding 106, the comparator 150 is required for its operation. The comparisons described are performed by the dwell control circuit 128 in response to the output of the comparator 150 which generates spark event signals representative of when the voltage level of the spark discharge signals represented by the waveforms 160, 162 exceed a voltage threshold $T_v$ and thereby indicate the time duration of the spark events.

Figure 3:
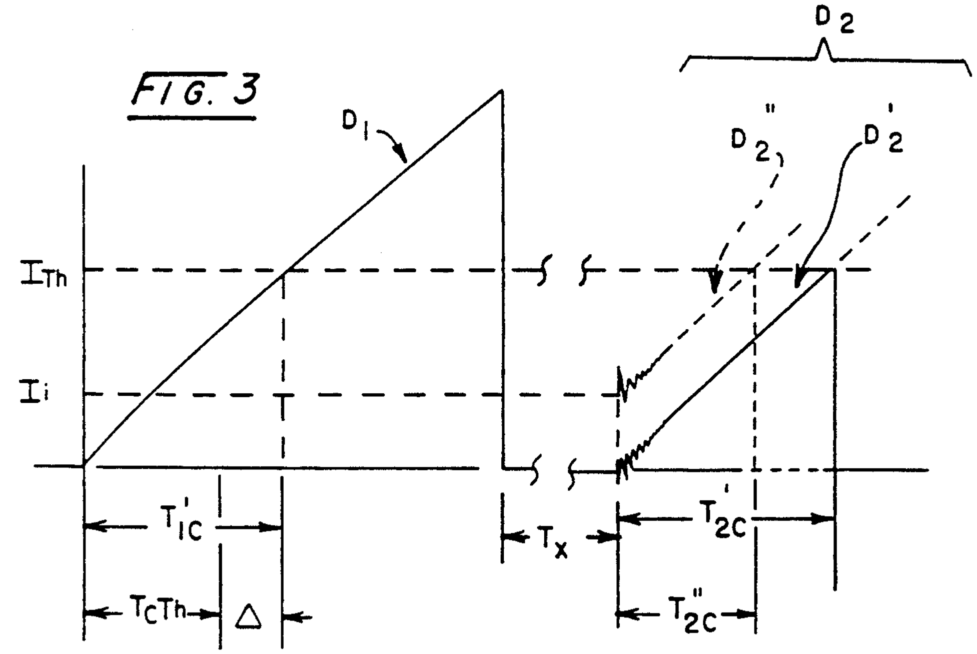
FIG. 3 is a graphic representation of primary coil current produced by the application of multiple dwell signals to the coil primary and showing differences in the current waveform present when a secondary circuit of an ignition coil of FIG. 1 is properly operating and when the secondary circuit includes a low impedance short circuit.

While coil energy dissipation rates are inferred by measuring spark duration times in accordance with the embodiment just described, the high levels and quality of voltages present on the coil primary may tend to affect the reliability. Accordingly, the presently preferred method and apparatus of the present invention utilizes a multiple dwell signal wherein two or more dwell signals are applied to the primary winding 104 as is illustrated in FIG. 3. In FIG. 3, two dwell signals $D_1$ and $D_2$ are applied to the primary winding 104 of the coil 102; however, it should be apparent that any reasonable number of dwell signals can be used in accordance with the present invention.

In the embodiment illustrated in FIG. 3, the second dwell signal $D_2$ is initiated after a fixed time delay $T_x$ following the first dwell signal $D_1$ and remains enabled at least until the coil current reaches a preselected magnitude $I_{Th}$. The fixed time delay $T_x$ between the first and second dwell signals $D_1$ and $D_2$ is set to be approximately equal to or greater than the spark duration time of a secondary circuit loaded with two clean spark plugs, such as the time $T_1$ of FIG. 2. By applying the second dwell signal $D_2$ in this manner, the subsequent dwell time provides an indication of the amount of energy that was expended in the preceding spark discharge, i.e. coil energy dissipation rate during the preceding spark event. With two clean spark gaps across the secondary winding 106 of the coil 102, the spark energy is substantially completely dissipated across the two gaps of the spark plugs 108, 110 during the time delay $T_x$.

If the second dwell signal $D_2$ is applied at the end of this substantially completed spark event, very little if any energy is recovered from the coil 102. The initial low energy at the start of the second dwell signal $D_2'$ results in a near zero initial current flow which results in a time $T_{2c}'$ for the current in the primary winding 104 of the coil 102 to reach the preselected magnitude $I_{Th}$ which substantially corresponds to the time $T_{1c}'$ similarly required for the current in the primary winding 104 to reach the preselected magnitude $I_{Th}$ upon the application of the first dwell signal $D_1$ or any dwell signal applied to the primary winding 104 of the coil 102 when the current flow in the primary winding 104 is initially substantially zero. Thus, the low impedance short circuit condition of the secondary winding circuit can be measured by comparing the charging times of the primary winding in response to both the first and second dwell signals $D_1$ and $D_2$ from the time of application until the coil primary current has reached or exceeded the preselected magnitude $I_{Th}$ or current threshold.

Normal spark gaps are identified when charge times $T_{2c}$ and $T_{1c}'$ satisfy the equation:

$$T_{2c} \geqq T_{1c}' - \Delta$$

where Δ provides a time guard-band. With one low impedance short circuit in the secondary winding circuit, such as one shorted spark plug 108 or 110, the spark energy is dissipated across a single spark gap of one spark plug 110 or 108. When the second dwell signal $D_2$ is applied, the original spark is in the midst of the glow phase with substantial coil energy still unexpended. This energy is recaptured at the start of the second dwell signal $D_2''$ and results in an instantaneous non-zero positive current flow $I_i$. This coil current offset permits the second dwell signal $D_2''$ to cause the current in coil primary 104 to increase to the preselected magnitude $I_{Th}$ in a shorter time period $T_{2c}''$. Thus, a low impedance short circuit in the secondary winding circuit is identified when charge times $T_{2c}$ and $T_{1c}'$ satisfy the equation:

$$T_{2c} < T_{1c}' - \Delta$$

To provide protection against false detection, the variable Δ may be set for the condition when a shorted plug 108 or 110 is under combustion. This calibration allows for the largest Δ value with reliable short circuit detection. Once a secondary short has been detected, this information may be communicated to a fuel control system (not shown) in order to inhibit fuel flow to the malfunctioning cylinder or cylinders. For additional information regarding such operation, the reader is referred to U.S. Pat. No. 4,969,443 which is incorporated herein by reference.

Since this embodiment of the present invention analyses the spark discharge signals via the current flow through the coil primary winding 106, the comparator 142 is required for its operation. The comparisons described are performed by the dwell control circuit 128 in response to the output of the comparator 142 which generates signals representative of when the current through the primary winding 104 meets or exceeds the preselected magnitude $I_{Th}$ of the primary winding current signals shown in FIG. 3. The second dwell signal $D_2$ can be applied for any reasonable time with the minimum time being the time required for the current in the coil primary 104 to reach $I_{Th}$. The time $T_{2c}$ can thus be determined by stopping the second dwell signal $D_2$ when the current in the primary 104 reaches $I_{Th}$ and measuring the length of the second dwell signal or by measuring the time required for the current in the primary 104 to reach $I_{Th}$ if the second dwell signal $D_2$ is selected to continue for a longer time, such as the time of the first dwell signal $D_1$.

While it is believed that the methods of the present invention are apparent from the foregoing description, a description of the methods of the present invention for detecting a low impedance short circuit in a secondary winding circuit of an ignition coil of an internal combustion engine having a distributorless ignition system will now be briefly described. In its broadest aspect, the method comprises the steps of: driving the primary winding 104 to generate spark discharge energy in the secondary winding 106 circuit which is connected to spark producing devices or spark plugs 108, 110 in first and second cylinders 112, 114 of the internal combustion engine 116 to form the secondary winding circuit, the first and second cylinders 112, 114 making up a cylinder pair of the internal combustion engine 116; monitoring the primary winding 104 for signals representative of spark discharge in the secondary winding 106 circuit; and, analyzing spark discharge signals on the primary winding 104 to detect a low impedance short circuit in the secondary winding 106 circuit.

In one embodiment, the step of analyzing the spark discharge signals to detect a low impedance short circuit in the secondary winding circuit comprises the steps of: comparing the duration times $T_1$ and $T_2$ of the spark discharge signals 160, 162 to a threshold spark duration time $T_{Th}$; and, indicating a low impedance short circuit if the duration times $T_1$ and $T_2$ of the spark discharge signals exceed the threshold spark duration time $T_{Th}$.

In another embodiment of the invention, the step of driving the primary winding to generate spark discharge energy in the secondary winding circuit comprises the step of providing at least first and second drive signals or dwell signals $D_1$ and $D_2$ to the primary winding 104 for each spark event. In this embodiment, the step of analyzing the spark discharge signals to detect a low impedance short circuit in the secondary winding circuit may comprise the steps of: determining a time period $T_{1c}'$ required for the first drive signal $D_1$ to produce current flow in the primary winding equal to a preselected magnitude $I_{Th}$; stopping the second drive signal $D_2$ to the primary winding 104 when current flowing in the primary winding 104 reaches the preselected magnitude $I_{Th}$; determining the time duration $T_{2c}$ of the second drive signal $D_2$; and, comparing the first time period $T_{1c}'$ of the first drive signal $D_1$ to the time duration $T_{2c}$ of the second drive signal $D_2$.

Alternately, the step of analyzing the spark discharge signals to detect a low impedance short circuit in the secondary winding circuit may comprise the steps of: determining a first time period $T_{1c}'$ required for the first drive signal $D_1$ to produce current flow in the primary winding 104 equal to a preselected magnitude $I_{Th}$; determining a second time period $T_{2c}$ required for the second drive signal $D_2$ to produce current flow in the primary winding 104 equal to the preselected magnitude $I_{Th}$; and, comparing the first and second time periods $T_{1c}'$ and $T_{2c}$. Preferably in either event, the step of comparing the first and second time periods $T_{1c}'$ and $T_{2c}$ comprises: determining a minimum duration time threshold $T_{cTh}$ for the second time period by subtracting a time guard-band Δ from the first time period $T_{1c}'$; and, comparing the second time period $T_{2c}$ to the minimum duration time threshold $T_{cTh}$.

The method may further comprise the steps of: indicating a normal secondary winding 106 circuit if the second time period $T_{2c}$ is greater than or equal to (≧) the minimum duration time threshold $T_{cTh}$; and, indicating a low impedance short circuited secondary winding 106 circuit if the time duration of the second time period $T_{2c}$ is less than (<) the minimum duration time threshold $T_{cTh}$.

Having thus described the methods and apparatus of the present invention in detail and by reference to preferred embodiments thereof, it will be apparent that modifications and variations are possible without departing from the scope of the invention defined in the appended claims.

What is claimed is:

1. A method of detecting a low impedance short circuit in a secondary winding circuit of an ignition coil of an internal combustion engine having a distributorless ignition system, the ignition coil including a secondary winding and an associated primary winding, said method comprising the steps of:

driving said primary winding to generate spark discharge energy in said secondary winding circuit which is connected to spark producing devices in first and second cylinders of the internal combustion engine to form said secondary winding circuit, said first and second cylinders making up a cylinder pair of the internal combustion engine;

monitoring said primary winding for signals representative of spark discharge in said secondary winding circuit; and analyzing spark discharge signals on said primary winding to detect a low impedance short circuit in said secondary winding circuit.

2. A method of detecting a low impedance short circuit in a secondary winding circuit of an ignition coil of an internal combustion engine having a distributorless ignition system as claimed in claim 1 wherein the step of analyzing said spark discharge signals to detect a low impedance short circuit in said secondary winding circuit comprises the steps of:

comparing the duration times of said spark discharge signals to a threshold spark duration time; and indicating a low impedance short circuit if the duration times of said spark discharge signals exceed said threshold spark duration time.

3. A method of detecting a low impedance short circuit in a secondary winding circuit of an ignition coil of an internal combustion engine having a distributorless ignition system as claimed in claim 1 wherein the step of driving said primary winding to generate spark discharge energy in said secondary winding circuit comprises the step of providing at least first and second drive signals to said primary winding for each spark event.

4. A method of detecting a low impedance short circuit in a secondary winding circuit of an ignition coil of an internal combustion engine having a distributorless ignition system, the ignition coil including a secondary winding and an associated primary winding, said method comprising the steps of:

driving said primary winding with at least first and second drive signals for each spark event to generate spark discharge energy in said secondary winding circuit which is connected to spark producing devices in first and second cylinders of the internal combustion engine to form said secondary winding circuit, said first and second cylinders making up a cylinder pair of the internal combustion engine;

monitoring said primary winding for signals representative of spark discharge in said secondary winding circuit; and analyzing spark discharge signals on said primary winding to detect a low impedance short circuit in said second winding circuit by performing the steps of:

determining a time period required for the first drive signal to produce current flow in said primary winding equal to a preselected magnitude;

stopping the second drive signal to said primary winding when current flowing in said primary winding reaches said preselected magnitude;

determining the time duration of the second drive signal; and comparing the first time period of the first drive signal to the time duration of the second drive signal.

5. A method of detecting a low impedance short circuit in a secondary winding circuit of an ignition coil of an internal combustion engine having a distributorless ignition system, the ignition coil including a secondary winding and an associated primary winding, said method comprising the steps of:

driving said primary winding with at least first and second drive signals for each spark event to generate spark discharge energy in said secondary winding circuit which is connected to spark producing devices in first and second cylinders of the internal combustion engine to form said secondary winding circuit, said first and second cylinders making up a cylinder pair of the internal combustion engine;

monitoring said primary winding for signals representative of spark discharge in said secondary winding circuit; and analyzing spark discharge signals on said primary winding to detect a low impedance short circuit in said second winding circuit by performing the steps of:

determining a first time period required for the first drive signal to produce current flow in said primary winding equal to a preselected magnitude;

determining a second time period required for the second drive signal to produce current flow in said primary winding equal to said preselected magnitude; and comparing said first and second time periods.

6. A method of detecting a low impedance short circuit in a secondary winding circuit of an ignition coil of an internal combustion engine having a distributorless ignition system as claimed in claim 5 wherein the step of comparing the first and second time periods comprises:

determining a minimum duration time threshold for said second time period by subtracting a time guard-band from said first time period; and comparing said second time period to said minimum duration time threshold.

7. A method of detecting a low impedance short circuit in a secondary winding circuit of an ignition coil of an internal combustion engine having a distributorless ignition system as claimed in claim 6 further comprising the steps of:

indicating a normal secondary winding circuit if the second time period is $\geqq$ said minimum duration time threshold; and indicating a low impedance short circuited secondary winding circuit if the time duration of said second time period is $<$ said minimum duration time threshold.

8. A method of detecting a low impedance short circuit in a secondary winding circuit of an ignition coil of an internal combustion engine having a distributorless ignition system, the ignition coil including a secondary winding and an associated primary winding, said method comprising the steps of:

driving said primary winding with at least first and second dwell signals for each spark event to produce at least first and second spark discharges at spark producing devices mounted, respectively, in first and second cylinders making up a cylinder pair of the internal combustion engine, said first and second spark producing devices being connected to said secondary winding to form said secondary winding circuit;

determining a first time period required for the first drive signal to produce current flow in said primary winding equal to a preselected magnitude;

determining a second time period required for the second drive signal to produce current flow in said primary winding equal to said preselected magnitude; and comparing the durations of said first and second time periods to detect a low impedance short circuit in said secondary winding circuit.

9. A method of detecting a low impedance short circuit in a secondary winding circuit of an ignition coil of an internal combustion engine having a distributorless ignition system as claimed in claim 8 wherein the step of determining a second time period required for the second drive signal to produce current flow in said primary winding equal to said preselected magnitude comprises the steps of:

stopping the second drive signal to said primary winding when current flowing in said primary winding reaches said preselected magnitude; and determining the time duration of the second drive signal.

10. A method of detecting a low impedance short circuit in a secondary winding circuit of an ignition coil of an internal combustion engine having a distributorless ignition system as claimed in claim 8 wherein the step of comparing the durations of said first and second time periods comprises:

determining a minimum time duration for said second time period by subtracting a time guard-band from the time duration of said first time period; and comparing said second time period to said minimum time duration.

11. A method of detecting a low impedance short circuit in a secondary winding circuit of an ignition coil of an internal combustion engine having a distributorless ignition system as claimed in claim 8 further comprising the steps of:

indicating a normal secondary winding circuit if said second time period is $\geqq$ said minimum time duration; and indicating a low impedance short circuited secondary winding circuit if said second time period is said minimum time duration.

12. A distributorless ignition system for an internal combustion engine comprising:

an ignition coil having a primary winding and a secondary winding;

first circuit means for driving said primary winding with dwell signals to produce spark discharges at first and second spark producing devices mounted, respectively, in first and second cylinders making up a cylinder pair of the internal combustion engine, said first and second spark producing devices being connected to said secondary winding to form a secondary winding circuit;

sensor means coupled to the primary winding of said ignition coil for generating primary signals representative of operation of said ignition coil in response to said dwell signals; and detector means coupled to said sensor means and responsive to said primary signals for detecting a low impedance short circuit in said secondary winding circuit.

13. A distributorless ignition system for an internal combustion engine as claimed in claim 12 wherein said primary signals are representative of voltage across said primary winding and said detector means provides for determining when said voltage is above a preselected threshold and for generating spark event signals representative thereof, said first circuit means further providing for comparing said spark event signals to a threshold spark duration time and indicating a low impedance short circuit in said secondary winding circuit when said threshold spark duration time is exceeded by said spark event signals.

14. A distributorless ignition system for an internal combustion engine as claimed in claim 12 wherein said first circuit means drives said primary winding with at least first and second dwell signals for each spark event, said primary signals are representative of current flow in said primary winding, said detector means provides for detecting when current in said primary winding reaches a predetermined level and for generating current mark signals representative thereof and, said first circuit means being responsive to current mark signals generated in response to said first dwell signals and current mark signals generated in response to said second dwell signals for detecting a low impedance short circuit in said secondary winding circuit.

15. A distributorless ignition system for an internal combustion engine comprising:

an ignition coil having a primary winding and a secondary winding;

first circuit means for driving said primary winding with at least first and second dwell signals for each spark event to produce spark discharges at first and second spark producing devices mounted, respectively, in first and second cylinders making up a cylinder pair of the internal combustion engine, said first and second spark producing devices being connected to said secondary winding to form a secondary winding circuit;

sensor means coupled to the primary winding of said ignition coil for generating primary signals representative of operation of said ignition coil in response to said at least first and second dwell signals and wherein said primary signals are representative of current flow in said primary winding; and detector means coupled to said sensor means and responsive to said primary signals for detecting when current in said primary winding reaches a predetermined level and for generating current mark signals representative thereof and, said first circuit means being responsive to current mark signals generated in response to said first dwell signals and current mark signals generated in response to said second dwell signals wherein said first circuit means compares the time periods of current mark signals generated in response to said second dwell signals to a threshold defined by the time periods of current mark signals generated in response to said first dwell signals less a guard-band time for detecting a low impedance short circuit in said secondary winding circuit.

16. A distributorless ignition system for an internal combustion engine comprising:

an ignition coil having a primary winding and a secondary winding;

first circuit means for driving said primary winding with at least first and second dwell signals to produce at least first and second spark discharges for each spark event at first and second spark producing devices mounted, respectively, in first and second cylinders making up a cylinder pair of the internal combustion engine, said first and second spark producing devices being connected to said secondary winding to form a secondary winding circuit;

sense means for generating a primary current signal representative of the current flowing in said primary winding; and detector means coupled to said sense means for detecting when current in said primary winding reaches a preselected threshold and generating current mark signals indicative thereof, said first circuit means being responsive to current mark signals generated in response to said first dwell signals and current mark signals generated in response to said second dwell signals for detecting a low impedance short circuit in said secondary winding circuit.

* * * * *